(12) United States Patent
Reichard

(10) Patent No.: US 6,459,605 B1
(45) Date of Patent: Oct. 1, 2002

(54) LOW INDUCTANCE TRANSISTOR MODULE WITH DISTRIBUTED BUS

(75) Inventor: Jeffrey A. Reichard, Oconomowoc, WI (US)

(73) Assignee: American Superconductor Corp., Westborough, MA (US)

(*) Notice: Subject to any disclaimer, the term of this patent is extended or adjusted under 35 U.S.C. 154(b) by 146 days.

(21) Appl. No.: 09/637,619

(22) Filed: Aug. 11, 2000

(51) Int. Cl.⁷ .............................. H02M 1/00; H05K 1/14
(52) U.S. Cl. ........................ 363/147; 363/144; 361/803
(58) Field of Search ................... 363/141, 144, 363/147; 361/803, 809, 790, 791, 775, 781, 785

(56) References Cited

U.S. PATENT DOCUMENTS

| | | | |
|---|---|---|---|
| 4,899,251 A | 2/1990 | Imai et al. | 361/346 |
| 5,027,253 A | * 6/1991 | Lauffer et al. | 361/718 X |
| 5,172,310 A | * 12/1992 | Deam et al. | 363/144 |
| 5,959,848 A | * 9/1999 | Groves et al. | 361/809 |

FOREIGN PATENT DOCUMENTS

| | | | |
|---|---|---|---|
| DE | G 94 03 108.8 | 5/1994 | H01L/25/11 |
| EP | 0 287 681 A1 | 10/1988 | H05K/3/46 |
| JP | 63-157677 | 6/1988 | H02M/7/5387 |
| JP | 8-274428 | 10/1996 | H05K/1/02 |
| JP | 9-135565 | 5/1997 | H02M/1/00 |
| JP | 2000-200948 | 7/2000 | H05K/1/02 |

OTHER PUBLICATIONS

International Search Report issued Feb. 20, 2002 by EPO.

* cited by examiner

*Primary Examiner*—Jessica Han
(74) *Attorney, Agent, or Firm*—Fish & Richardson P.C.

(57) ABSTRACT

A switching module includes a first printed circuit board for mounting a switching element. To reduce inductance, the switching module includes a distributed bus. By electrically connecting a power bus disposed on the printed circuit board with a conducting sheet, the switching module provides a distributed bus having an inductance that is smaller than the inductance of the power bus. When the first conducting sheet is on a second printed circuit board, a plurality of conducting posts extends from the first printed circuit board to support the second printed circuit board. Alternatively, the conducting sheet and the power bus can be on the same printed circuit board, in which case a via in contact with the power bus and the conducting sheet provides electrical communication to create a distributed bus.

34 Claims, 11 Drawing Sheets

LOW INDUCTANCE TRANSISTOR MODULE WITH DISTRIBUTED BUS

BACKGROUND

Modern switching circuits use power transistors as switching elements. In a typical switching circuit, one or more power transistors are mounted, together with other components, on a printed circuit board. Two buses connected to a power supply provide the power that the transistors are to switch on and off. The printed circuit board, together with all the components mounted on the board, form a switching module, or transistor module. A switching circuit typically includes many of these transistor modules.

A difficulty associated with the design of high-power switching circuits is that the transistor modules within the switching circuit are often afflicted with parasitic inductance. This parasitic inductance is caused, in part, by currents flowing through the power buses that feed the various components of the transistor module. Inductance in an electronic circuit is analogous to mass, or inertia, in a mechanical system. Just as an ocean liner cannot quickly stop and change direction because of its mass, a switching circuit with high inductance cannot switch current on and off quickly. In addition, just as an ocean liner cannot easily be stopped at a precise location, a switching circuit with high inductance cannot easily switch from one level to another without briefly overshooting the target level.

The tendency of a switching circuit to overshoot its desired target level can cause considerable difficulties when, as is the case with power inverters, the transistor modules within the switching circuit handle large amounts of power. The voltage overshoot, which is caused in part by the parasitic inductance of the transistor modules, can reach hundreds of volts. This is enough to cause a failure within a transistor module and the destruction of its constituent components.

SUMMARY

The present invention reduces the effective inductance of a switching module in a switching circuit by providing at least one additional conducting surface for current flowing on the power bus. The power bus and the additional conducting surface, when electrically connected, define a distributed bus having an inductance that is less than the inductance of the bus acting alone.

The additional conducting surface, or conducting sheet, can be on a second printed circuit board separate from the first printed circuit board on which the power bus is disposed. Alternatively, the conducting sheet can be on another surface or in the interior of the same printed circuit board on which the power bus is disposed.

When the bus and the conducting sheet are on separate printed circuit boards, conducting posts extend between the two printed circuit boards to support one printed circuit board opposite the other and to provide electrical communication between the power bus on one printed circuit board and a conducting sheet on the other printed circuit board.

When the power bus and the conducting sheet are on the same printed circuit board, a via provides electrical communication between the power bus and the conducting sheet. In the case of a multi-layer printed circuit board, the via can penetrate up to a selected depth into the printed circuit board to reach a conducting sheet buried in an inside layer of the board. In the case of a single layer printed circuit board in which the conducting sheet is on the opposite side of the board from the power bus, the via can penetrate the printed circuit board to provide electrical communication between the power bus and the conducting sheet.

Regardless of whether the conducting sheet is on the same printed circuit board or a different printed circuit board, the use of a conductive post or a via enables the switching module having a distributed bus to maintain the same footprint as a conventional switching module.

The switching module of the invention typically includes a first printed circuit board for mounting a switching element. The first printed circuit board has a first power bus, for connection to a positive terminal of an external power supply for providing power to a switching element mounted on the first printed circuit board. A first conducting sheet is electrically connected to the first power bus. Together, the first conducting sheet and the first power bus form a distributed bus having a distributed bus inductance that is less than the inductance of the power bus. The first conducting sheet can be disposed on the first printed circuit board or on a second printed circuit board.

In the case in which the first conducting sheet is on a second printed circuit board, one or more conducting posts extending between the first and second printed circuit boards provide electrical communication between the first power bus and the first conducting sheet. In the case in which the first conducting sheet is on the first printed circuit board, one or more vias penetrating into the board can provide electrical communication between the first power bus and the first conducting sheet.

The first printed circuit board can also has a second power bus connected to a negative terminal of the external power supply and providing power to the switching element. The first and second power buses are electrically connected to first and second conducting sheets. These conducting sheets can be side-by-side on a common surface of either the first printed circuit board or a second printed circuit board, or on opposed surfaces of a second printed circuit board. Alternatively, the conducting sheets can be buried in the interior of a multi-layer board.

Conducting posts extend between the first and second printed circuit boards to provide electrical communication between the first power bus and the first conducting sheet and between the second power bus and the second conducting sheet. If necessary, a via can extend into or through a printed circuit board to provide electrical communication to a conducting sheet that is not easily accessible with a conducting post.

To further reduce the effective inductance of the transistor module, the first and second conducting sheets can be connected by a capacitance. The presence of a capacitance further reduces the voltage overshoot that accompanies rapid switching by the transistor module.

By reducing the effective inductance of the transistor module, the distributed bus of the invention enables the circuit designer to reduce the rise and fall times (collectively referred to as the "transition times") of the transistor module's output square wave. The reduction in transition time results in lower switching losses and a reduction in voltage overshoot. As a result, the distributed bus enables more efficient operation without a significantly increased risk of excessively high transient voltages. By providing a conducting sheet on the first printed circuit board or on a second printed circuit board opposed to the first printed circuit board, the transistor module with reduced inductance maintains the same footprint as a conventional transistor module.

These and other features of the invention will be apparent from the following detailed description and the accompanying figures, in which:

DETAILED DESCRIPTION

Figure 1:
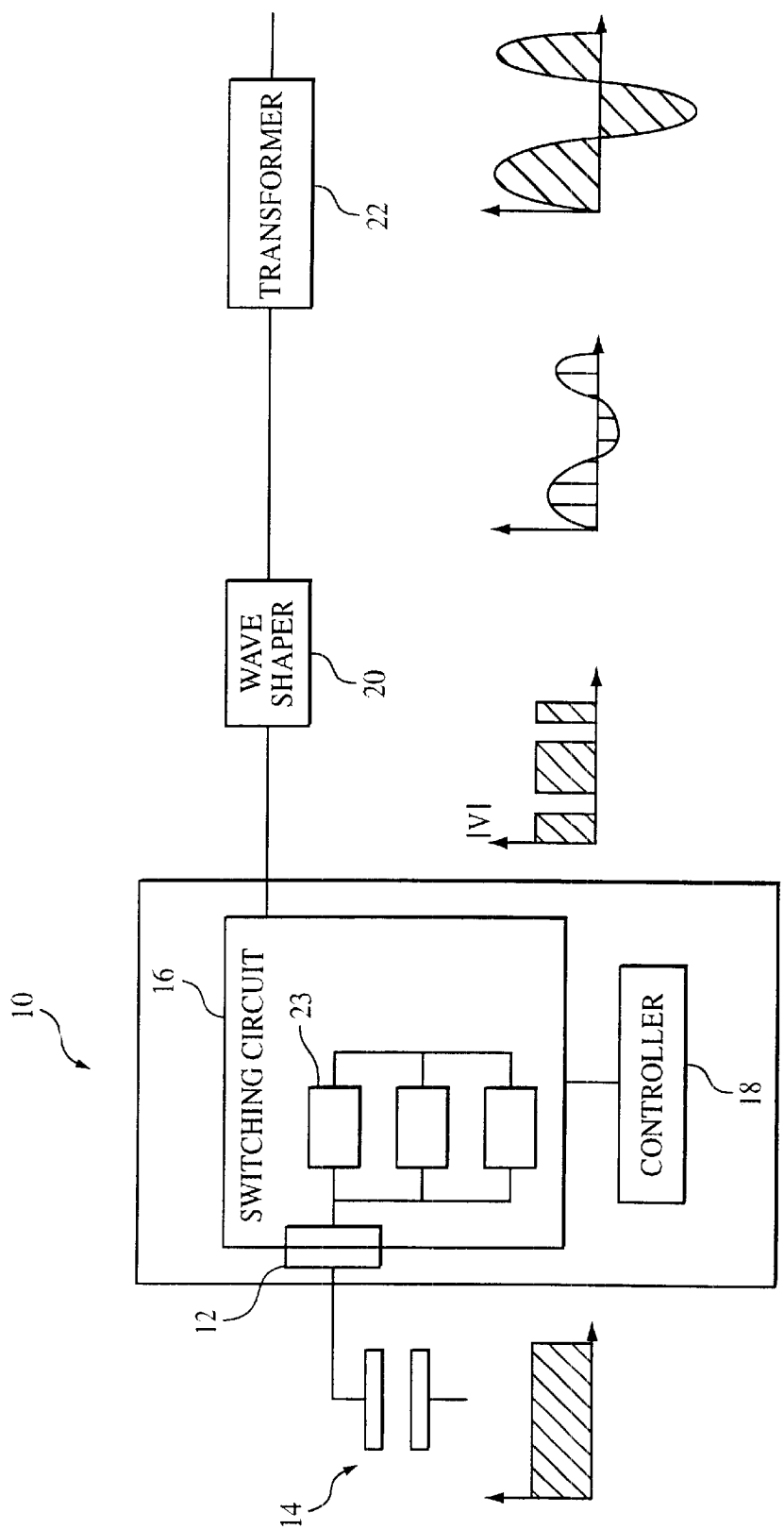
FIG. 1 is a block diagram of a power inverter incorporating a transistor module according to the invention.

The low inductance transistor module with distributed bus according to the invention may be used in various power applications, such as in power conversion applications. One particular application of the transistor module is in a power inverter 10 used to convert DC power to AC power, as shown in FIG. 1. The illustrated power inverter 10 has an input terminal 12 for connection to an external DC power source 14. In low-power applications, an external DC power source 14 might be a solar cell, a battery, or a fuel cell. In high-power applications, the external DC power source 14 might be a capacitor bank charged by a line-source and tapped for backup power upon failure of the line-source.

Current provided by the DC power source 14 is provided to input terminals of a switching circuit 16. In response to control signals provided by a controller 18, the switching circuit 16 switches on and off, thereby generating an output pulse train that forms the output of the power inverter 10. The output pulse train is provided to a wave-shaper 20 that filters selected harmonics to form an output sinusoidal waveform having the desired frequency. This waveform is then provided to a transformer 22 to adjust its amplitude to the desired level. Alternatively, the output pulse train of the power inverter 10 can be provided to a motor, the inductance of which filters the output pulse train.

Figure 2:
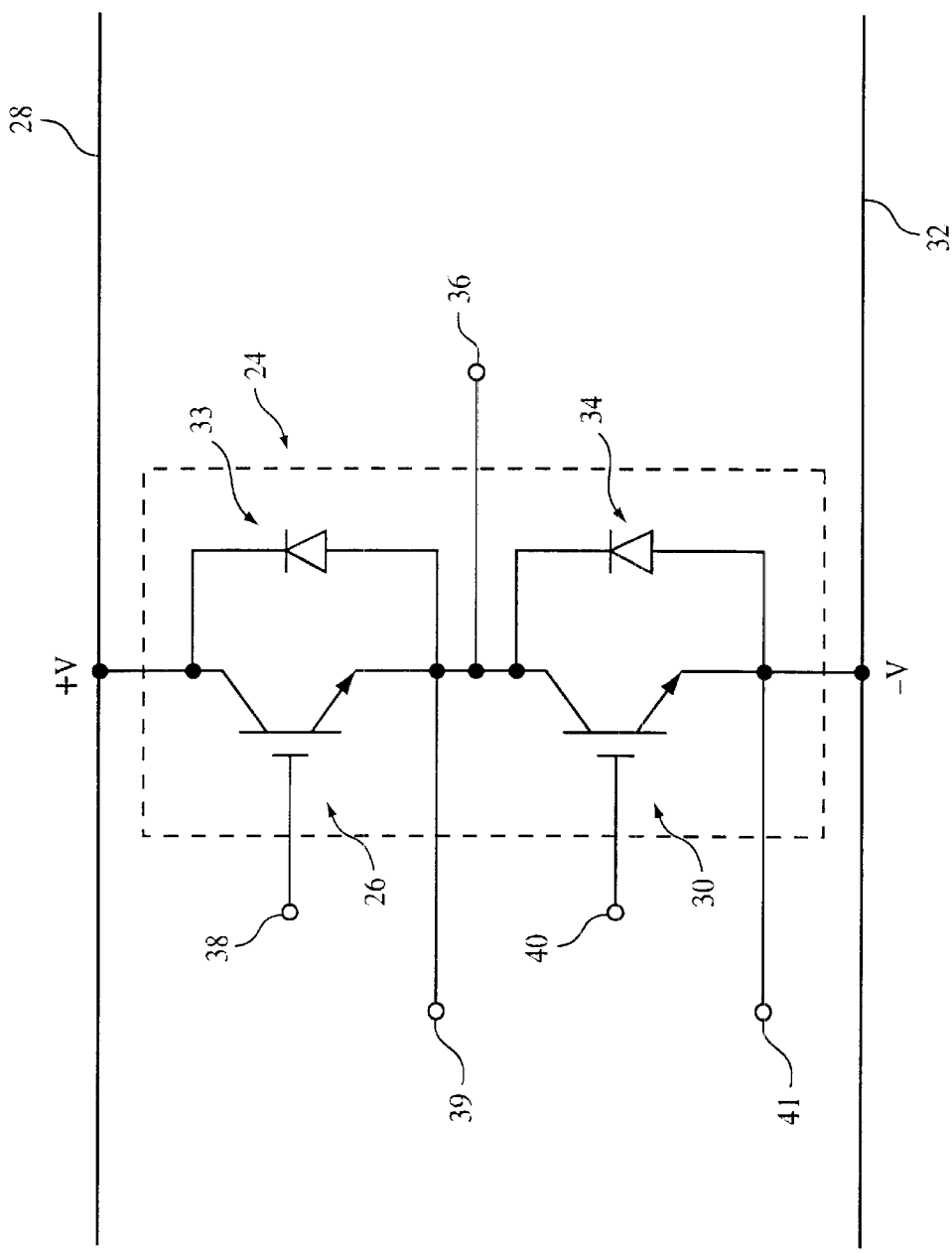
FIG. 2 is a circuit diagram of one switching element from the transistor module shown in FIG. 1.

The switching action of the switching circuit 16 is achieved by a plurality of transistor modules 23. Each transistor module 23 includes a plurality of switching elements 24, a representative one of which is shown in FIG. 2. The illustrated switching element 24 includes: a first transistor 26 having a collector terminal connected to a first power bus 28 maintained at a positive potential by the DC power source 14; and a second transistor 30 having an emitter terminal connected to a second power bus 32 maintained at a negative potential by the DC power source 14. The first and second transistors 26, 30 are usually insulated gate bipolar transistors (IGBT) having first and second diodes 33, 34 across their respective collector and emitter terminals. Transistor modules of this type are available from a variety of manufacturers, including Eupec GmBH of Warstein, Germany. However, the invention is also applicable to other types of switching or transistor modules.

The output of the switching element 24, which is ultimately supplied to the wave-shaper 20, is taken from an output node 36 connecting the emitter terminal of the first transistor 26 to the collector terminal of the second transistor 30. The first and second transistors 26, 30 switch between their off-state to their saturated state in response to a control signal provided by the controller 18. The control signal provided to the transistors is the voltage difference between the gate terminals 38, 40 and their respective low-power emitter terminals 39, 41.

Figure 3:
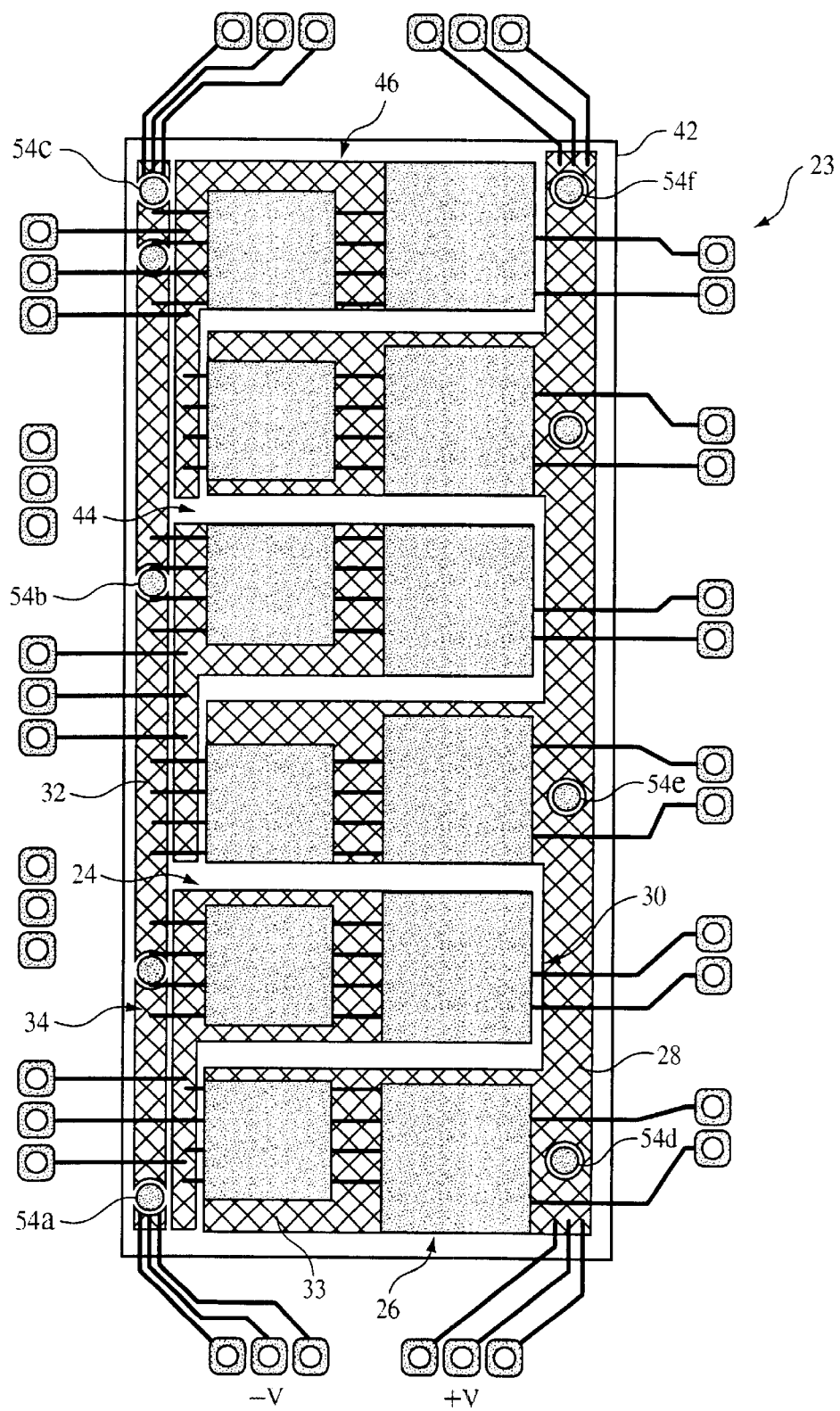
FIG. 3 is a plan view of the transistor module of FIG. 1.

In a representative transistor module 23, as shown in FIG. 3, the illustrated switching element 24 and two additional switching elements 44, 46 are mounted on a printed circuit board 42 as shown in FIG. 3. Each of the three switching elements 24, 44, 46 is connected to positive and negative terminals of the external DC power supply 14 by the first and second power buses 28, 32, both of which are disposed on the printed circuit board 42.

It is well known that whenever a power bus on a transistor module carries a current, a magnetic field encircles the power bus. In high-power applications, the first and second power buses 28, 32 can be carrying considerable current. Hence, the magnetic field encircling the first and second buses 28, 32 is apt to have a very large amplitude. A considerable amount of energy is thus stored in the magnetic field surrounding the first and second buses 28, 32.

It is also well-known that a magnetic field tends to resist change. Thus, when the current that supports a magnetic field is turned off, the magnetic field attempts to sustain itself by using some of its stored energy to generate a voltage and thereby induce its own current to make up for the lost current. Conversely, when a current is first turned on, the magnetic field generated by that current generates a voltage in an attempt to induce a current to cancel the applied current. In an electronic circuit, this tendency of the magnetic field to resist change manifests itself as "inductance."

In either case, the magnitude of the voltage is directly dependent on how rapidly the supporting current is switched on or off. If the change in the supporting current is slow, the induced voltage will be small. On the other hand, if the supporting current changes quickly, the induced voltage can be very high. Inductance in an electronic circuit is thus analogous to mass, or inertia, in a mechanical system. Just as a massive object is insufficiently nimble to easily stop at a designated location and abruptly change direction, a switching circuit with high inductance is insufficiently nimble to stop at a designated voltage and abruptly change direction.

In a transistor module, an extended transition time is associated with overheating. This is because the during the transition period, the voltage and current are both non-zero. As a result, the power dissipated during the transition period, which is the integral of voltage times current during the transition period, is non-zero. The energy represented by this integral is wasted as heat. It is therefore desirable that the transistor module generate an output having as short a transition time as possible. Since inductance in a circuit tends to resist rapid changes in current, it follows that any inductances within the transistor module be reduced or eliminated.

Figure 4:
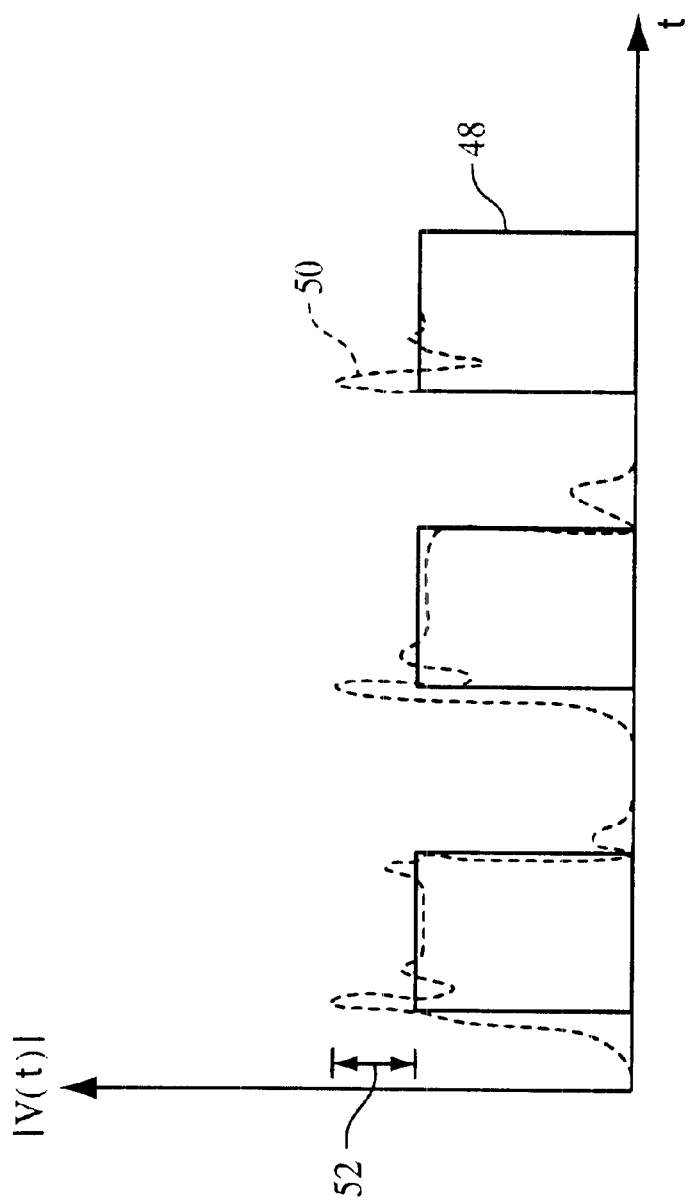
FIG. 4 compares a desired output of the transistor module of FIG. 1 with a representative output displaying the effect of parasitic inductance within the transistor module.

FIG. 4 compares the desired output 48 of the switching circuit 16 with the actual output 50. Note that the actual output 50 has a finite rise time and that there exists a voltage overshoot 52. The magnitude of the voltage overshoot 52 depends on the magnitude of the current handled by the switching circuit's constituent transistor modules 23 and the transition times. In high-power applications, this voltage overshoot 52 can easily be large enough to cause the transistor modules 23 to fail. For example, a transistor module 23 that switches a 100 amp current on and off can experience a voltage overshoot 52 of as much as 100 volts. Such high voltages can cause extremely high currents that lead to overheating and failure of semiconductor components of the transistor module 23.

To some extent, the inductance of the switching circuit 16 can be reduced by connecting the various circuit elements with multiple leads. This technique relies on the fact that when inductive elements, such as leads, are connected in parallel, the inductance is reduced. For example, in FIG. 3, each transistor connects to its corresponding diode with three leads. The equivalent inductance for the combination of three leads is only one-third the inductance of any one lead by itself.

The first and second power buses 28, 32 on the printed circuit board each have an associated inductance. Because they carry so much current, the contribution of the inductance of these buses 28, 32 to the voltage overshoot 52 is significant. Although the inductance of these buses 28, 32 can be reduced by changing their aspect ratios, any appreciable change would require increasing the footprint of the transistor module 16.

Figure 5:
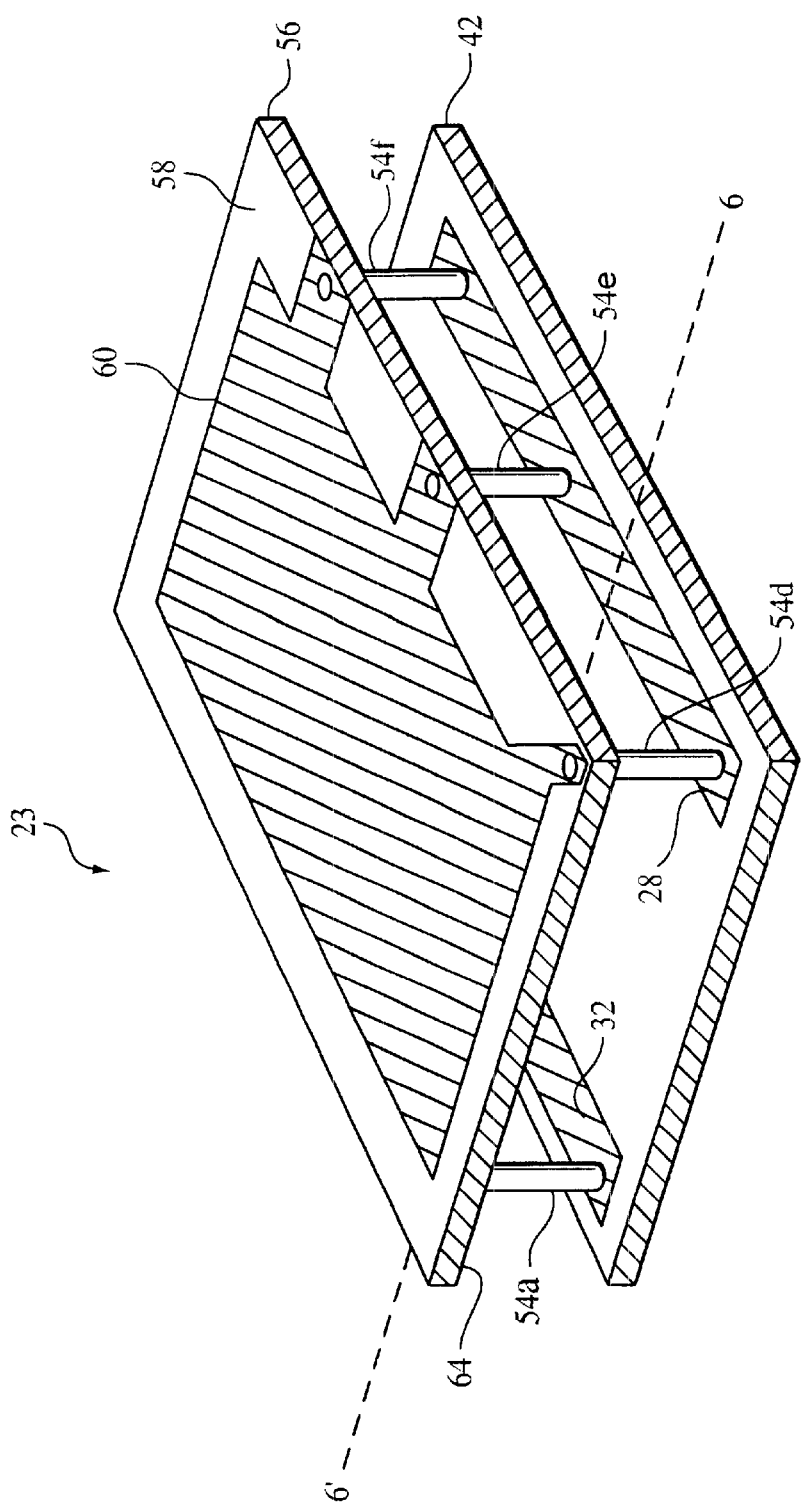
FIG. 5 is an isometric view of a transistor module with a distributed bus, according to the invention.

FIG. 5 illustrates a structure for reducing the inductance associated with the first and second power buses 28, 32. To simplify the drawing, circuit components not essential to an understanding of the invention are omitted. In the illustrated structure, a plurality of support posts 54a–f extend from the first printed circuit board 42 to support a second printed circuit board 56. The support posts 54a–f have a conductive layer, such as copper. The exact number of support posts and their placement can be varied depending on the nature of the circuit on the first printed circuit board, the need to provide mechanical stability, and manufacturing constraints.

The support posts 54a–f are disposed on the first printed circuit board so that they contact the first and second buses 28, 32, as shown in FIG. 3. Because the support posts 54a–f are conductive, they can be used to provide an electrical connection to the first and second buses. As shown in FIG. 3, a first plurality of support posts 54d–f is in electrical contact with the first power bus 28 and a second plurality of support posts 54a–c is in electrical contact with the second power bus 32.

The second printed circuit board 56 has a top surface 58 on which is disposed a first conducting sheet 60. The first plurality of support posts 54d–f extends from the first bus 28 to the first conducting sheet 60. Because they are electrically connected together by the first plurality of support posts 54d–f, the first conducting sheet 60 and the first bus 28 form a first distributed bus having a geometry, and hence an inductance, that differs from that of the first bus 28. The first conducting sheet 60 can be thought of as an infinite number of infinitesimally narrow buses placed side-by-side with an infinitesimal gap between each pair of buses. Each of these infinitesimally narrow buses has an inductance caused by the magnetic field from the infinitesimally narrow portion of the total current on the first conducting sheet 60. Since the infinitesimally narrow buses are parallel to each other, the effective inductance of the first distributed bus is smaller than that of the first bus 28 by itself.

Figure 6:
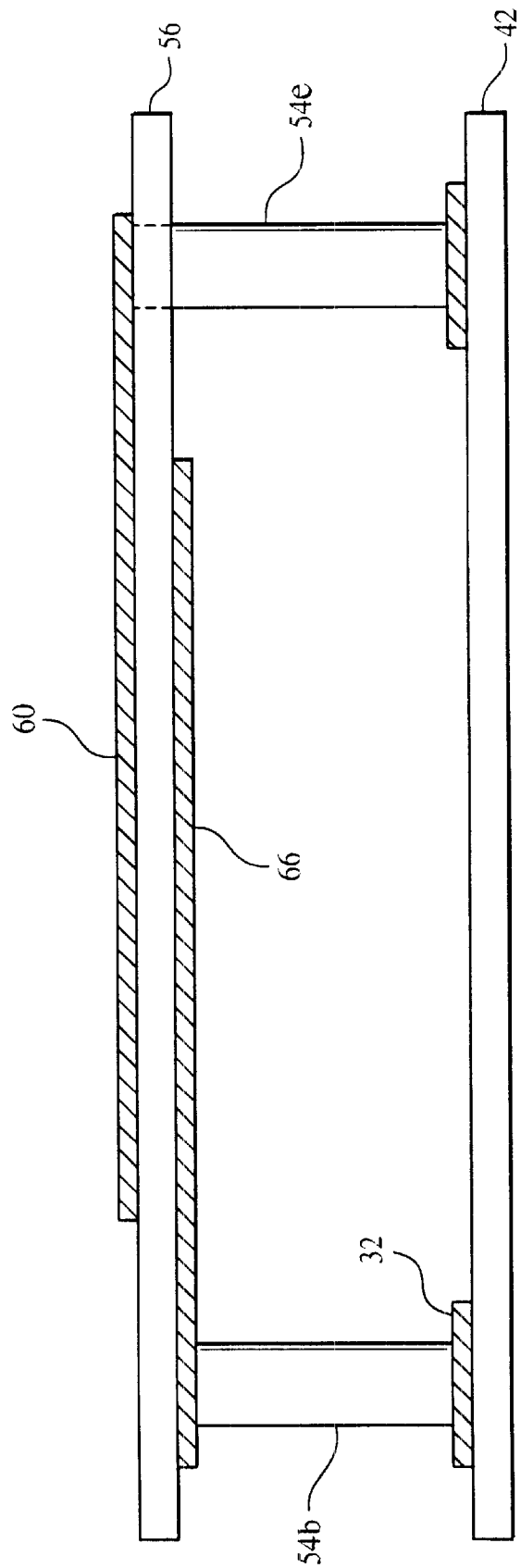
FIG. 6 is a cross-section of the transistor module of FIG. 5.

The second printed circuit board 56 also has a second surface 64 opposed to the first surface 58, as shown in the cross-sectional view of FIG. 6. On this second surface 64 is a second conducting sheet 66 that is electrically connected to the second bus 32 by the second plurality of support posts 54a–c. Because they are electrically connected by the second plurality of support posts 54a–c, the second conducting sheet 66 and the second bus 32 form a second distributed bus. Like the first conducting sheet 60, the second conducting sheet 66 can be thought of as providing a large number of inductances in parallel. As a result, the effective inductance of the second distributed bus is again smaller than that of the second bus 32 by itself.

The number of supporting posts and their placement depend on the specific layout of the printed circuit boards and the elements already mounted to them. The number of support posts is selected to be sufficient to carry the current that normally flows on the first and second buses 28, 32. A larger number of support posts is preferable for further reducing inductance since the parallel inductances of the support posts would then reduce the effective inductance of the combination of support posts The electrical connection between the two portions of the distributed bus can also be provided by a long support post that extends along the length of a power bus, or a significant fraction thereof. Such a support post corresponds to the limiting case of an infinite number of support posts placed infinitely close together.

As used herein, the term conducting sheet is not limited to a continuous sheet. A conducting sheet can be a mesh of conducting strips or a set of parallel conducting strips or wires. In addition, the term conducting sheet is not limited to a rectangle or quadrilateral. Nor is a conducting sheet constrained to lie on a strictly planar surface.

The placement of the first and second conducting sheets 60, 66 on opposed first and second surfaces 58, 64 of the second printed circuit board is advantageous because magnetic fields resulting from the oppositely directed currents flowing on the first and second conducting sheets 60, 66 tend to cancel, thereby further reducing the overall inductance of the transistor module 23. However, for ease of fabrication, the first and second conducting sheets 60, 66 can also be placed together on the first surface 58 of the second printed circuit board as shown in FIG. 7.

Figure 7:
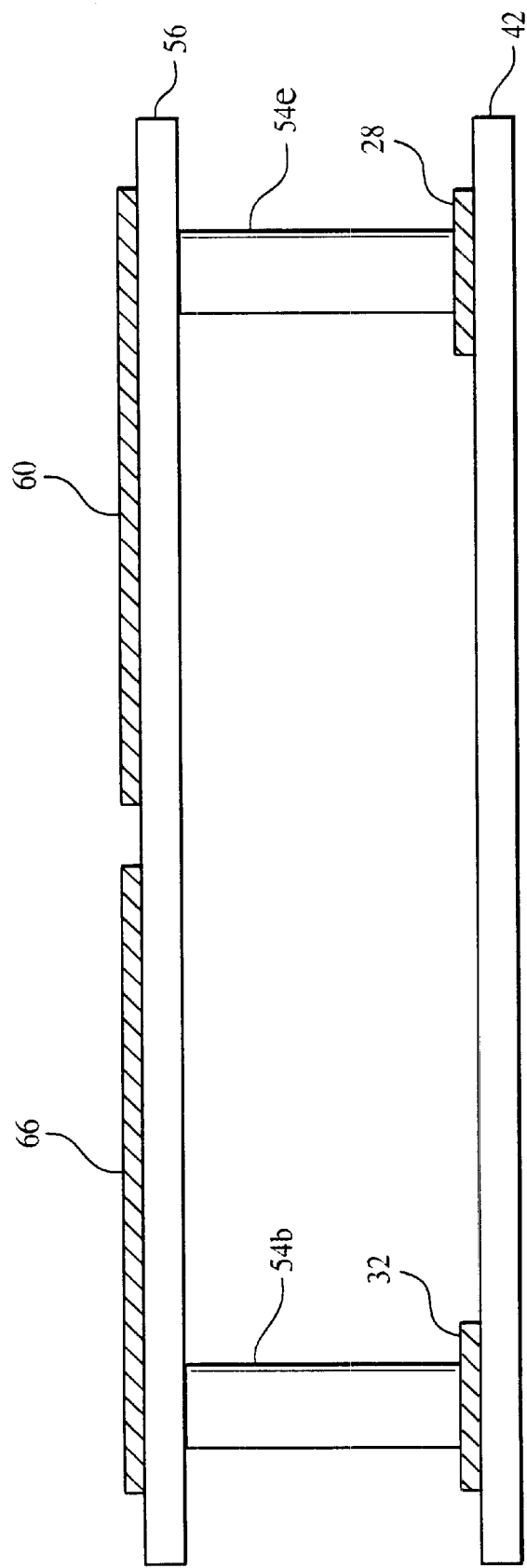
FIG. 7 is a transistor module in which two distributed buses share one side of a second printed circuit board.
Figure 8:
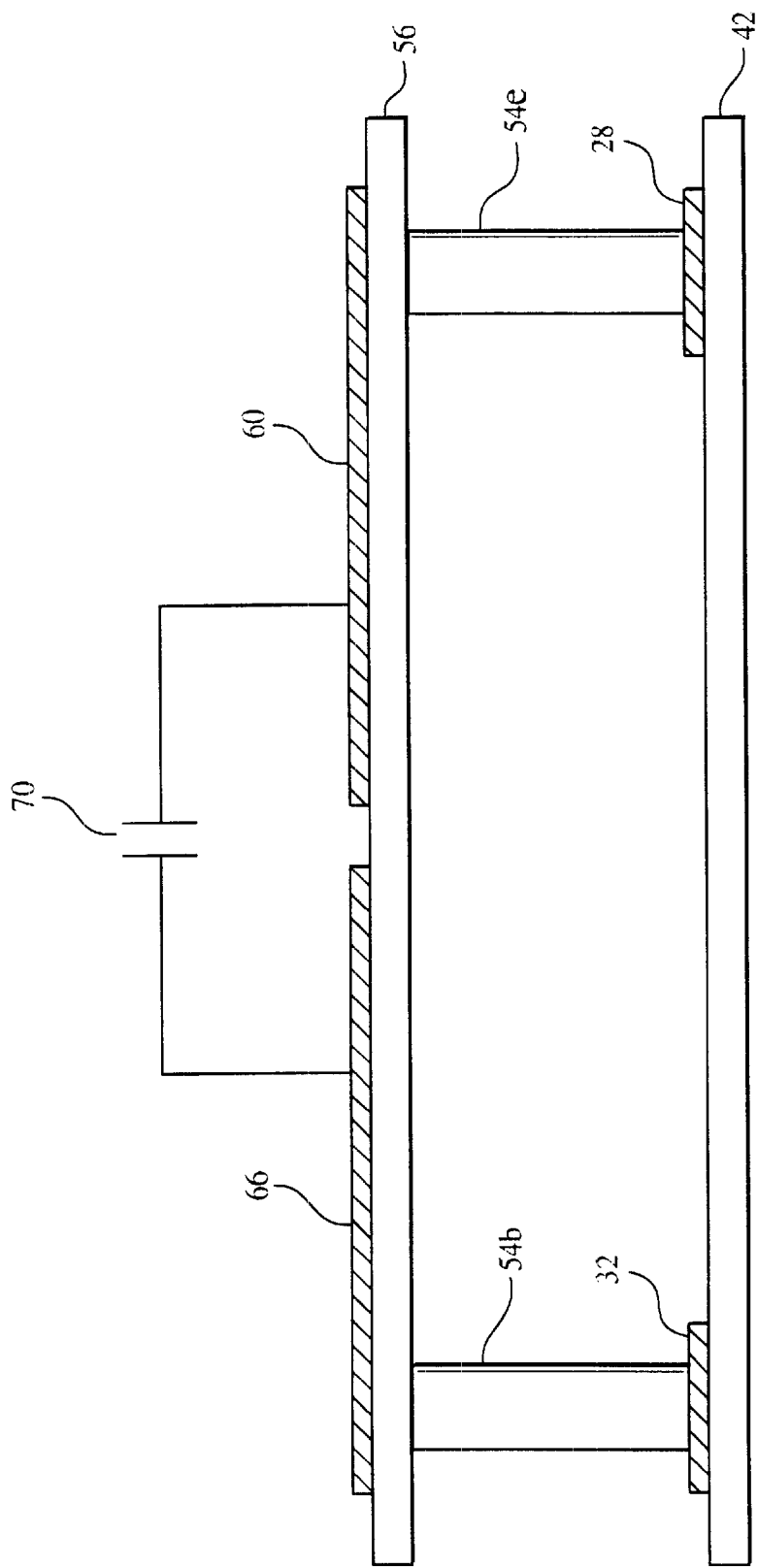
FIG. 8 is the transistor module of FIG. 7 with a capacitance coupling the two distributed buses.

The voltage overshoot can be further reduced by providing a capacitance 70 between the first and second conducting sheets 60, 66 as shown in FIG. 8 for the embodiment of FIG. 7.

The embodiments shown thus far have included a two-layer structure. It is possible, however, to have three or more printed circuit board layers by using support posts in between adjacent layers to provide electrical communication between conducting sheets in the manner already described in connection with the embodiments of FIG. 6 and 7. Additional printed circuit boards can be disposed above the second printed circuit board 56 or below the first printed circuit board 42, or both.

Figure 9:
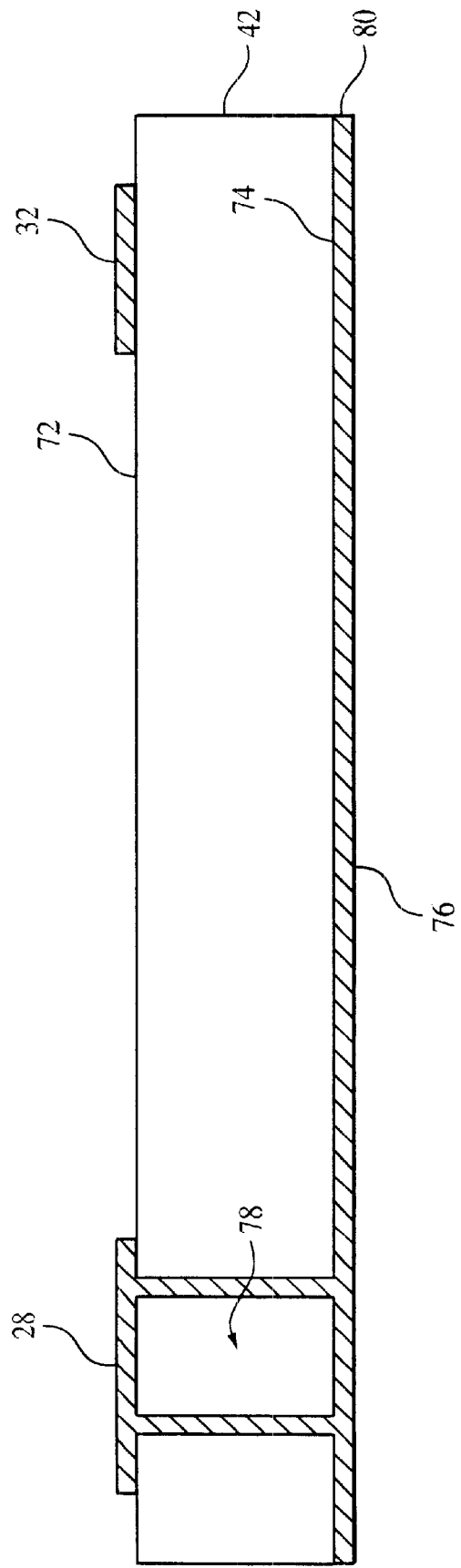
FIG. 9 is an embodiment of a transistor module according to the invention in which the distributed bus is on two sides of a single printed circuit board.
Figure 10:
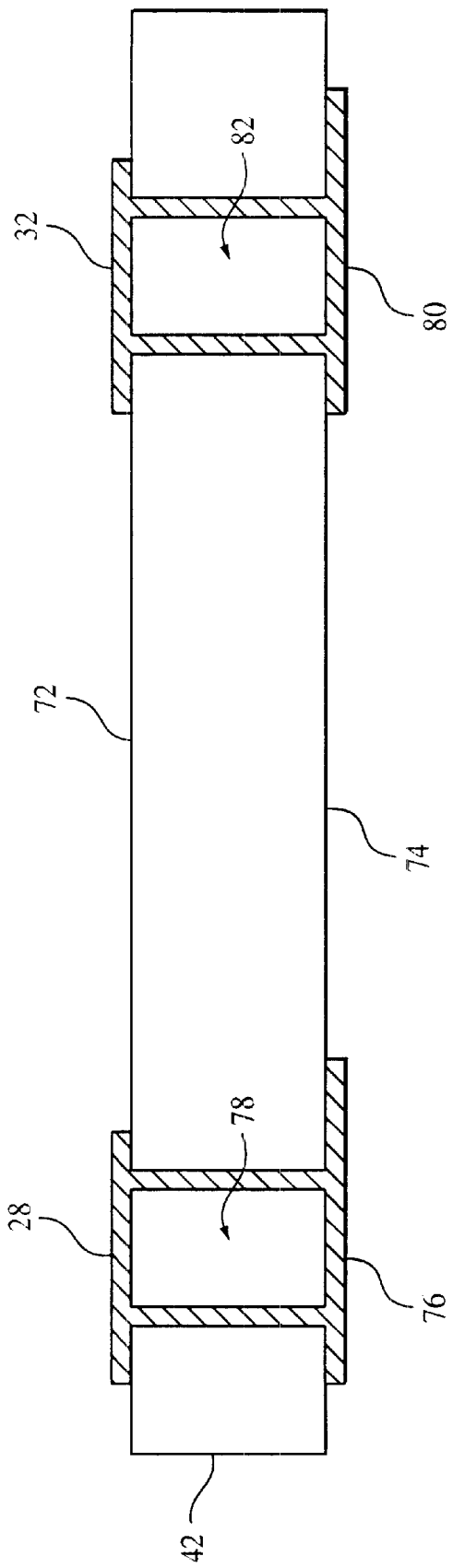
FIG. 10 is an embodiment in which two distributed buses occupy two sides of a printed circuit board.

A distributed bus can also be provided on a single printed circuit board, as shown in FIG. 9. In the embodiment illustrated in FIG. 9, the first printed circuit board 42 has a top side 72, on which the first and second buses 28, 32 are disposed, and a bottom side 74 on which a first conducting sheet 76 is disposed. A tunnel with a conducting wall, referred to as a "via" 78, provides an electrical connection between the first bus 28, on the top side 72, and the first conducting sheet 76, on the bottom side 74. In one variant of the embodiment of FIG. 10, the bottom side 74 includes a second conducting sheet 80 and a second via 82 provides an electrical connection between the second bus 32 and the second conducting sheet 80.

Figure 11:
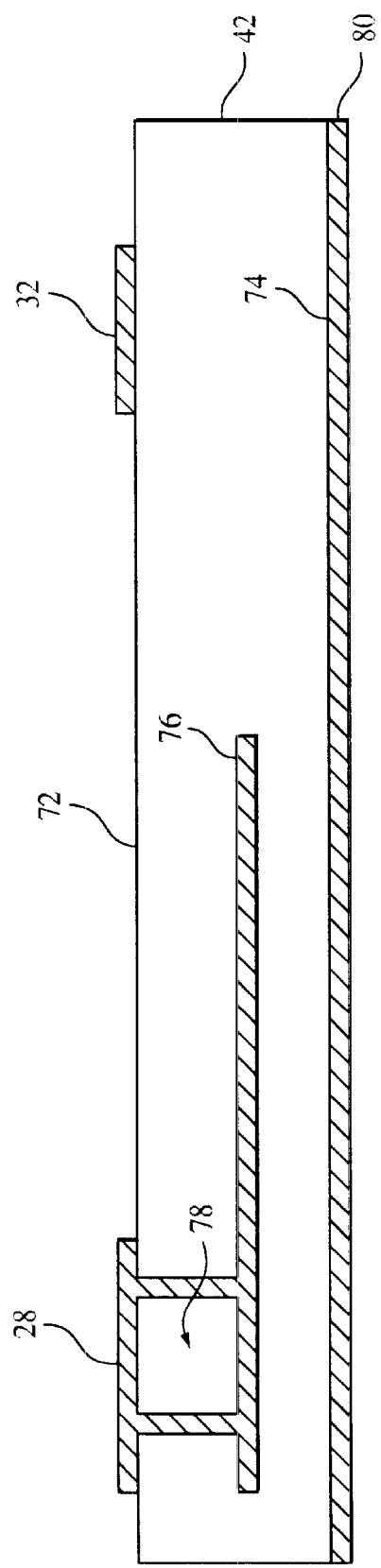
FIG. 11 is an embodiment on a multi-layer board in which a portion of the distributed bus is in an interior surface of the multi-layer board.

When the printed circuit board 42 is a multi-layer printed circuit board, the first conducting sheet 76 can be on one of the interior surfaces of the multi-layer printed circuit board as shown in FIG. 11. In this embodiment, the via 78 penetrates into the multi-layer printed circuit board only to the extent required to provide a connection to the first conducting sheet 76.

While the foregoing description describes the application of the invention to a transistor module, it is understood that the principles of the invention are applicable to any switching circuit in which excessive inductance hampers rapid switching. As such, the foregoing embodiment is intended to be illustrative of an application of the principles of the invention and not limiting the scope of the invention, as set forth in the claims that follow.

What I claim as new, and secured by letters patent, is:

1. A switching module comprising:
   a first printed circuit board for mounting a switching element;
   a first distributed-bus having a first distributed bus inductance, said first distributed bus including:
      a first power bus disposed on said first printed circuit board for providing a connection between said switching element and a first polarity of a voltage source, said first power bus having a first power bus inductance greater than said first distributed bus inductance; and
      a first conducting sheet electrically connected to said first power bus.

2. The switching module of claim 1 further comprising a second printed circuit board on which is disposed said first conducting sheet.

3. The switching module of claim 2 further comprising a conducting post extending between said first printed circuit board and said second printed circuit board, said conducting post having a first end in electrical communication with said first power bus and a second end in electrical communication with said first conducting sheet.

4. The switching module of claim 2 wherein said first printed circuit board is coplanar with a first plane and said second printed circuit board is coplanar with a second plane.

5. The switching module of claim 4 wherein said first and second planes are parallel.

6. The switching module of claim 1 further comprising a second distributed bus, said second distributed bus having a second distributed bus inductance and including:
   a second power bus disposed on said first printed circuit board for connection between a second polarity of said voltage source and said switching element, said second power bus having a second power bus inductance that is greater than the second distributed bus inductance; and
   a second conducting sheet in electrical communication with said second power bus.

7. The switching module of claim 6 further comprising a second printed circuit board on which said first and second conducting sheets are disposed.

8. The switching module of claim 7 further comprising a plurality of conducting posts extending between said first printed circuit board and said second printed circuit board, each of said conducting posts having a first end attached to said first printed circuit board and a second end attached to said second printed circuit board.

9. The switching module of claim 7 wherein said second printed circuit board has a first surface on which said first conducting sheet is disposed and a second surface on which said second conducting sheet is disposed.

10. The switching module of claim 7 wherein said first printed circuit board is coplanar with a first plane and said second printed circuit board is coplanar with a second plane.

11. The switching module of claim 10 wherein said first and second planes are parallel.

12. The switching module of claim 7 wherein said second printed circuit board has a first surface on which said first conducting sheet and said second conducting sheet are disposed.

13. The switching module of claim 6 further comprising a capacitance connected between said first conducting sheet and said second conducting sheet.

14. The switching module of claim 1 wherein a via provides electrical communication between said first conducting sheet and said first power bus.

15. The switching module of claim 14 wherein said first printed circuit board is a multi-layer printed circuit board and said first conducting sheet is disposed at an interior layer of said first printed circuit board.

16. The switching module of claim 14 wherein said first conducting sheet is disposed on a surface of said first printed circuit board, said second surface being opposite from a first surface of said first printed circuit board on which said first power bus is disposed.

17. A switching module comprising:
   a first printed circuit board for mounting a switching element, said first printed circuit board having disposed thereon a first power bus for connection between said switching element and a first polarity of a power supply;
   a first conducting path extending from said first printed circuit board, said first conducting path being in electrical communication with said first power bus;
   a second printed circuit board supported by said first conducting path, said second printed circuit board having a first surface on which is disposed a first conducting sheet in electrical communication with said first conducting path, thereby providing electrical communication between said first power bus and said first conducting sheet.

18. The switching module of claim 17 further comprising:
   a second power bus for connection to a second polarity of said external power supply, said second power bus being provided on said first printed circuit board;
   a second conducting sheet provided on said second printed circuit board; and
   a second conducting path extending between said second conducting sheet and said second power bus and providing electrical communication between said second power bus and said second conducting sheet.

19. The switching module of claim 18 wherein said second conducting sheet is provided on said first surface of said second printed circuit board.

20. The switching module of claim 18 wherein said second printed circuit board includes a second surface opposed to said first surface and said second conducting sheet is provided on said second surface.

21. The switching module of claim 18 further comprising a capacitance electrically connected to said first conducting sheet and to said second conducting sheet.

22. The switching module of claim 17 wherein said first conducting path comprises at least one conducting post.

23. The switching module of claim 17 wherein said first conducting path comprises a at least one via.

24. A switching module comprising:
- a first printed circuit board for mounting a switching element;
- a second printed circuit board;
- a first distributed bus having a first distributed bus inductance, said first distributed bus including
  - a first power bus disposed on said first printed circuit board for connection to a first polarity of a power supply to said switching element, said first power bus having a first power bus inductance that is greater than said first distributed bus inductance,
  - a first conducting sheet disposed on said second printed circuit board; and
  - an electrical connection between said first power bus and said first conducting sheet.

25. The switching module of claim 24 further comprising a second distributed bus, said second distributed bus including:
- a second power bus for connecting to a second polarity of said power supply, said second power bus being provided on said first printed circuit board;
- a second conducting sheet provided on said second printed circuit board; and
- an electrical connection between said second power bush and said second conducting sheet.

26. The switching module of claim 25 further comprising a capacitance connected between said first distributed bus and said second distributed bus.

27. A switching module comprising:
- a printed circuit board having a first side and a second side;
- a distributed bus for connection to a first polarity of a power supply, said distributed bus including
  - a first conducting path for connection to said first polarity of said power supply, said first conducting path being provided on said first side,
  - a second conducting path provided on said second side; and
  - an electrical connection between said first conducting path and said second conducing path.

28. A method of reducing parasitic inductance of a switching module, the method comprising:
- disposing, on a first printed circuit board surface a first power bus for connection to a first polarity of a power supply, said first power bus having a first power bus inductance;
- disposing, on a second printed circuit board surface a first conducting sheet; and
- connecting said first power bus to said first conducting sheet, thereby forming a first distributed bus having an inductance smaller than said first power bus inductance.

29. The method of claim 28 wherein disposing said first power bus on said first surface comprises disposing said first power bus on a first surface of a first printed circuit board; and disposing said first conducting sheet on said second surface comprises disposing said first conducting sheet on a first surface of a second printed circuit board.

30. The method of claim 29 further comprising attaching said first printed circuit board to said second printed circuit board.

31. The method of claim 28 further comprising
- disposing, on said first surface, a second power bus for connection to a second polarity of a power supply;
- disposing, on said second surface, a second conducting sheet; and
- connecting said second power bus to said second conducting sheet, thereby forming a second distributed bus.

32. The method of claim 31 further comprising providing a capacitance between said first distributed bus and said second distributed bus.

33. A switching module comprising:
- a printed circuit board for mounting a switching element;
- a first distributed-bus having a first distributed bus inductance, said first distributed bus including:
  - a first power bus disposed on said printed circuit board for providing a connection between said switching element and a first polarity of a voltage source, said first power bus having a first power bus inductance greater than said first distributed bus inductance; and
  - a first conducting sheet electrically connected by a via to said first power bus.

34. The switching module of claim 33 wherein said printed circuit board is a multi-layer printed circuit board and said first conducting sheet is in an interior layer thereof.

* * * * *